United States Patent
Park et al.

(10) Patent No.: US 9,336,077 B2
(45) Date of Patent: May 10, 2016

(54) METHOD AND APPARATUS FOR DECODING LDPC CODE

(71) Applicant: Electronics and Telecommunications Research Institute, Daejeon (KR)

(72) Inventors: Sung Ik Park, Daejeon (KR); Heung Mook Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 153 days.

(21) Appl. No.: 14/031,882

(22) Filed: Sep. 19, 2013

(65) Prior Publication Data
US 2014/0281795 A1   Sep. 18, 2014

(30) Foreign Application Priority Data
Mar. 14, 2013   (KR) .................. 10-2013-0027184

(51) Int. Cl.
*H03M 13/11*   (2006.01)
*G06F 11/10*   (2006.01)
*H03M 13/53*   (2006.01)

(52) U.S. Cl.
CPC .............. *G06F 11/10* (2013.01); *H03M 13/112* (2013.01)

(58) Field of Classification Search
CPC . G06F 11/10; G06F 11/1076; G06F 11/1008; H03M 13/112; H03M 13/09; H03M 13/091; H03M 13/116; H04L 1/0061; H04L 1/0057; H04L 1/0045
See application file for complete search history.

(56) References Cited

U.S. PATENT DOCUMENTS

| | | | |
|---|---|---|---|
| 2006/0020868 A1 * | 1/2006 | Richardson et al. | 714/752 |
| 2006/0026486 A1 | 2/2006 | Richardson et al. | |
| 2006/0274772 A1 * | 12/2006 | Kim et al. | 370/412 |
| 2007/0283218 A1 | 12/2007 | Gopalakrishnan et al. | |

FOREIGN PATENT DOCUMENTS

| | | | | |
|---|---|---|---|---|
| EP | 1838000 A2 | 9/2007 | | |
| KR | 10-2012-0096627 A | 8/2012 | | |
| WO | WO2012032371 A1 * | 3/2012 | ............ | H03M 13/39 |

* cited by examiner

*Primary Examiner* — April Y Blair
*Assistant Examiner* — Dipakkumar Gandhi

(57) ABSTRACT

There are provided a method and apparatus for decoding an LDPC code. In this specification, a first result is calculated by performing the calculation of a check node having two inputs forward and recursively, a second result is calculated by performing the calculation of the check node having the two inputs backward and recursively, and the check node is calculated using the first result and the second result as the inputs.

11 Claims, 11 Drawing Sheets

METHOD AND APPARATUS FOR DECODING LDPC CODE

Priority to Korean patent application number 10-2013-0027184 filed on Mar. 14, 2013, the entire disclosure of which is incorporated by reference herein, is claimed.

BACKGROUND OF THE INVENTION

1. Field of the Invention

The present invention relates to the decoding of a Low Density Parity Check (LDPC) code and, more particularly, to a high-performance decoding method having low complexity.

2. Discussion of the Related Art

A method of decoding a Low Density Parity Check (LDPC) code includes a sum-product algorithm, a minimum-sum algorithm, an offset minimum-sum algorithm, and a normalized minimum-sum algorithm.

The sum-product algorithm has excellent performance, but has high complexity and requires the estimation of a distribution of channel noises. The minimum-sum algorithm has very low complexity and does not need to estimate a distribution of channel noises, but has poor performance.

In order to improve a reduction in the performance of the minimum-sum algorithm, modified minimum-sum algorithms, such as the normalized minimum-sum algorithm and the offset minimum-sum algorithm, were proposed.

The normalized minimum-sum algorithm and the offset minimum-sum algorithm have very excellent performance in a regular LDPC code, but still have low performance in an irregular LDPC code.

In order to improve the deterioration of the performance of an LDPC code occurring in using the minimum-sum algorithm, the normalized minimum-sum, and the offset minimum-sum algorithm, a new minimum-sum algorithm is proposed and a check node calculation method for implementing an LDPC decoding algorithm having low complexity is also proposed.

SUMMARY OF THE INVENTION

An object of the present invention is to efficiently use a minimum-sum algorithm.

Another object of the present invention is to provide a method and apparatus for calculating a check node having a plurality of inputs.

Yet another object of the present invention is to provide an apparatus and method for decoding an LDPC.

In accordance with an aspect of the present invention, a method of calculating a check node applied to a decoding algorithm of an LDPC code includes calculating a first result by performing a calculation of the check node having two inputs forward and recursively, calculating a second result by performing the calculation of the check node having the two inputs backward and recursively, and calculating the check node using the first result and the second result as inputs.

In accordance with another aspect of the present invention, a method of decoding an LDPC code includes calculating a first result by performing a calculation of the check node having two inputs forward and recursively, calculating a second result by performing the calculation of the check node having the two inputs backward and recursively, and calculating the check node using the first result and the second result as the input.

In accordance with yet another aspect of the present invention, an apparatus for decoding an LDPC code includes a memory for storing or updating a value of a check node, an operation unit for performing a decoding operation using the value of the check node, wherein the operation unit calculates a first result by performing a calculation of the check node having two inputs forward and recursively, calculates a second result by performing the calculation of the check node having the two inputs backward and recursively, and calculates the check node using the first result and the second result as the inputs.

DETAILED DESCRIPTION OF THE EMBODIMENTS

Figure 1:
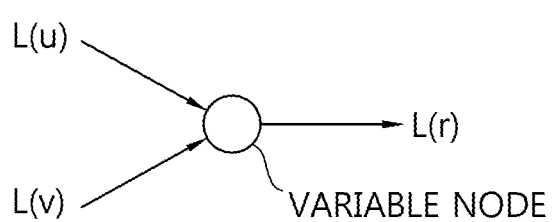
FIG. 1 shows an example of a variable node to which the present invention is applied.

Hereinafter, some embodiments of the present invention are described in detail with reference to the accompanying drawings in order for a person having ordinary skill in the art to which the present invention pertains to be able to readily implement the invention. It is to be noted the present invention may be implemented in various ways and is not limited to the following embodiments. Furthermore, in the drawings, parts not related to the present invention are omitted in order to clarify the present invention and the same or similar reference numerals are used to denote the same or similar elements.

The objects and effects of the present invention can be naturally understood or will become clear by the following description, and the objects and effects of the present invention are not restricted by the following description only.

The objects, characteristics, and merits will become more apparent from the following detailed description. Furthermore, in describing the present invention, a detailed description of a known art related to the present invention will be omitted if it is deemed to make the gist of the present invention unnecessarily vague. A preferred embodiment in accordance with the present invention is described in detail below with reference to the accompanying drawings.

In general, an LDPC code can include a variable node and a check node. Decoding is performed through the iterative information transfer of check nodes and variable nodes. This is also called iterative decoding.

Figure 2:
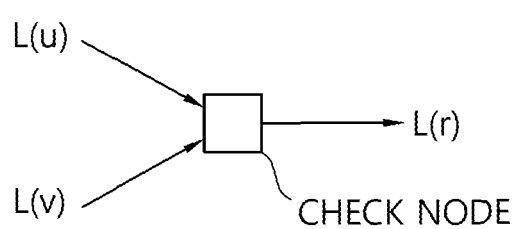
FIG. 2 shows an example of a check node to which the present invention is applied.

FIG. 1 shows an example of a variable node to which the present invention is applied, and FIG. 2 shows an example of a check node to which the present invention is applied. FIGS. 1 and 2 correspond to a case including two inputs and three edges. Here, the edge means a line connecting the nodes.

First, a sum-product algorithm for the decoding of an LDPC code is described below.

As an example of the sum-product algorithm, if the number of inputs is two, information update in the variable node is the same as Equation 1 and information update in the check node is the same as Equation 2.

$$L(r) = L(u) + L(v) \quad \text{[Equation 1]}$$

$$\tanh\left(\frac{L(r)}{2}\right) = \tanh\left[\frac{L(u)}{2}\right] \cdot \tanh\left[\frac{L(v)}{2}\right] \quad \text{[Equation 2]}$$

$$\Leftrightarrow L(r) = 2\tanh^{-1}\left\{\tanh\left[\frac{L(u)}{2}\right] \cdot \tanh\left[\frac{L(v)}{2}\right]\right\}$$

$$= \ln\cosh\left(\frac{L(u)+L(v)}{2}\right) - \ln\cosh\left(\frac{L(u)-L(v)}{2}\right)$$

In Equations 1 and 2, L(u) and L(v) indicate information about the respective inputs of each node, and L(r) indicates information about the output of each node. Furthermore, in a Binary Input-Additive White Gaussian Noise Channel (BI-AWGNC), L(m) is the same as Equation below.

$$L(m) = \frac{2}{\sigma^2}m \quad \text{[Equation 3]}$$

In Equation 3, $\sigma^2$ indicates a distribution of channel noises.

That is, in the case of the sum-product algorithm, in a variable node, output information is represented by the sum of pieces of input information. In a check node, output information is represented by the product of a function 'tan h( )' of pieces of input information.

Accordingly, in order to decode an LDPC code using the sum-product algorithm, a distribution of channel noises (i.e., $\sigma^2$) needs to be estimated and the function 'tan h( )' or a function 'ln(cos h( ))' needs to be calculated. In general, the function 'tan h( )' or the function 'ln(cos h( ))' is implemented by a look-up table.

The minimum-sum algorithm can be used in order to avoid the calculation of the function 'tan h( )' or 'ln(cos h( ))' or the estimation of a distribution of channel noises.

A minimum-sum algorithm for the decoding of an LDPC code is described below.

As an example of the minimum-sum algorithm, if the number of inputs is two, information update in the variable node is the same as Equation 4 and information update in the check node is the same as Equation 5.

$$r = u + v \quad \text{[Equation 4]}$$

$$r = \text{sign}(u)\text{sign}(v)\min(|u|,|v|) \quad \text{[Equation 5]}$$

In Equations 4 and 5, 'u' and 'v' indicate pieces of information about the inputs of each node, and 'r' indicates information about the output of each node. 'sign( )' indicates the code of an input value. 'min( )' indicates a minimum value of input values.

That is, in the case of a minimum-sum algorithm, in a variable node, output information is represented by the sum of pieces of input information and in a check node, output information is represented by a minimum value multiplied by codes of pieces of input information.

If an LDPC code is decoded using the minimum-sum algorithm, it is not necessary to estimate a distribution of channel noises and a computational load is low, but the minimum-sum algorithm has lower performance than the sum-product algorithm.

In order to improve the deterioration of performance attributable to the use of the minimum-sum algorithm, a normalized minimum-sum algorithm or an offset minimum-sum algorithm can be used.

A normalized minimum-sum algorithm for the decoding of an LDPC code is described below.

As an example of the normalized minimum-sum algorithm, if the number of inputs is two, information update in the variable node is the same as Equation 6 and information update in the check node is the same as Equation 7.

$$r = u + v \quad \text{[Equation 6]}$$

$$r = \alpha \cdot \text{sign}(u)\text{sign}(v)\min(|u|,|v|) \quad \text{[Equation 7]}$$

In Equations 6 and 7, $\alpha$ is a constant for the normalization of a check node (e.g., '$\alpha$<1'), and $\alpha$ can be properly selected depending on an LDPC code used.

An offset minimum-sum algorithm for the decoding of an LDPC code is described below.

As an example of the offset minimum-sum algorithm, if the number of inputs is two, information update in the variable node is the same as Equation 8 and information update in the check node is the same as Equation 9.

$$r = u + v \quad \text{[Equation 8]}$$

$$r = \text{sign}(u)\text{sign}(v)\max(\min(|u|,|v|) - \beta, 0) \quad \text{[Equation 9]}$$

In Equations 8 and 9, $\beta$ is an offset value of the check node and can be properly selected depending on an LDPC code used.

As a result of analyzing Bit Error Rate (BER) performance according to a decoding algorithm for an LDPC code having a coding rate of 0.4, $\alpha(=0.83)$ and $\beta(=0.3)$ can be selected so that the LDPC code having a coding rate of 0.4 has the best performance. The LDPC decoding algorithm having a coding rate of 0.4 is used in the digital satellite broadcasting standard DVB-S2 of Europe.

An improved minimum-sum algorithm is described below. In the improved minimum-sum algorithm, a function 'ln(cos h( ))' in a sum-product algorithm is approximated linearly or stepwise and then converted into that in a minimum-sum algorithm. In this case, complexity is low because a process of estimating channel noise is obviated, and performance is close to that of the sum-product algorithm.

Figure 11:
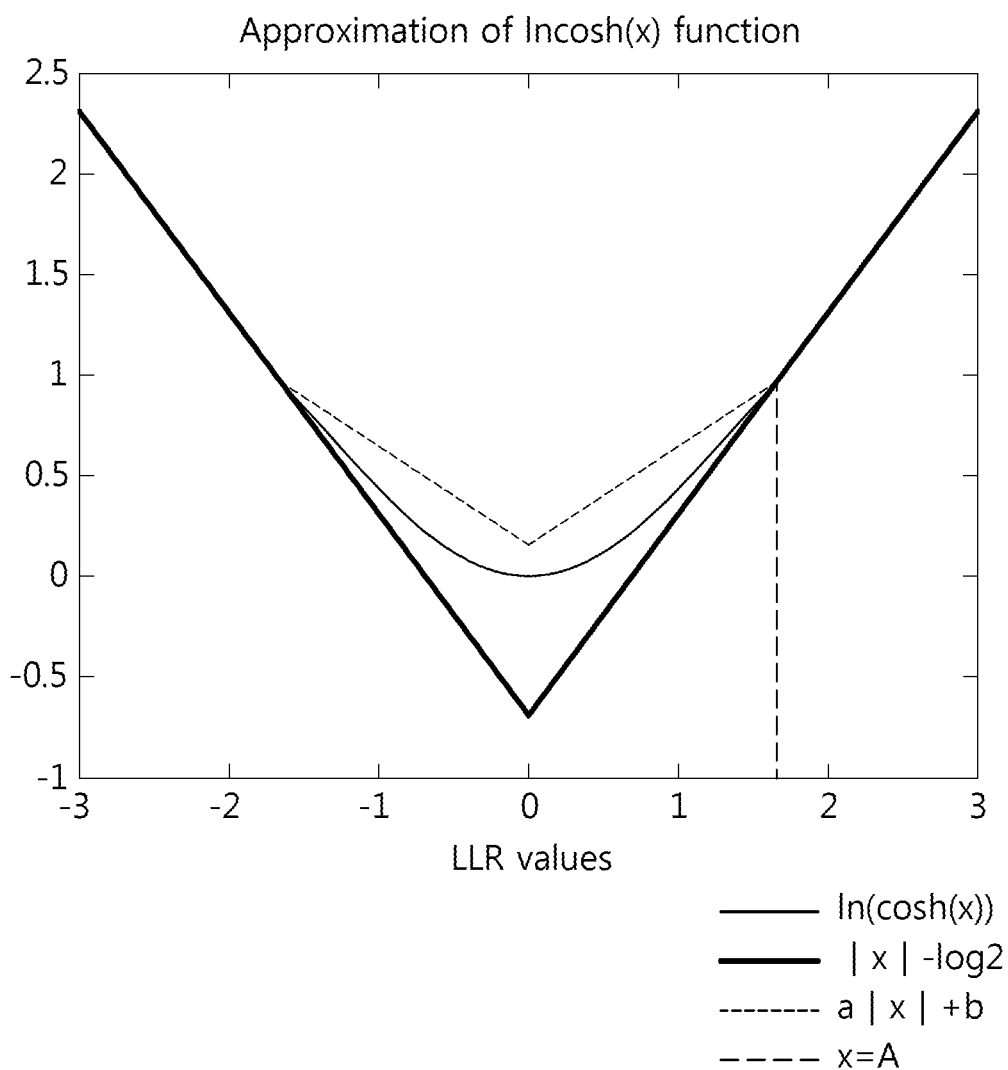
FIG. 11 is a diagram showing an example of the approximation of a function 'ln(cos h( ))'.

FIG. 11 is a diagram showing an example of the approximation of a function 'ln(cos h( ))'.

Referring to FIG. 11, the function 'ln(cos h( ))' can be approximated as in Equation below.

$$\ln\cosh(x) \approx \begin{cases} a|x| + b, & \text{if } |x| \le A \\ |x| - \ln 2, & \text{otherwise,} \end{cases} \quad \text{[Equation 10]}$$

In Equation 10, 'a' is a slope of an equation obtained by approximating a function 'ln cos h( )' into a linear function, 'b' is an intercept in a vertical axis, and A is '(b+ln 2)/(1−a)'.

If Equation 10 is used and the number of inputs is two, information update in the variable node is the same as Equation 11 and information update in the check node is the same as Equation 12.

$$r = u + v \quad \text{[Equation 11]}$$

$$L(r) = \begin{cases} a \cdot \text{sign}(u)\text{sign}(v)\min(|u|,|v|), & |u+v| \leq \sigma_{op}^2 \cdot A, \\ & |u-v| \leq \sigma_{op}^2 \cdot A \\ \text{sign}(u)\text{sign}(v)\min(|u|,|v|) - C_{offset}, & |u+v| > \sigma_{op}^2 \cdot A, \\ & |u-v| \leq \sigma_{op}^2 \cdot A \\ \text{sign}(u)\text{sign}(v)\min(|u|,|v|) + C_{offset}, & |u+v| \leq \sigma_{op}^2 \cdot A, \\ & |u-v| > \sigma_{op}^2 \cdot A \\ \text{sign}(u)\text{sign}(v)\min(|u|,|v|) & |u+v| > \sigma_{op}^2 \cdot A, \\ & |u-v| > \sigma_{op}^2 \cdot A \end{cases} \quad \text{[Equation 12]}$$

In Equations 11 and 12, a value '$C_{offset}$' is '$(\sigma_{op}^2)(b+\ln 2)/4$'. '$\sigma_{op}^2$' is a distribution of channel noises in an operating point, and '$\sigma_{op}^2$' is properly selected depending on an LDPC code like the normalization constant '$\alpha$' of a normalized minimum-sum algorithm or the offset value '$\beta$' of an offset minimum-sum algorithm. '$\sigma_{op}^2$' can be differently selected depending on an LDPC code, but is a value not changed after the value is initially set.

Figure 3:
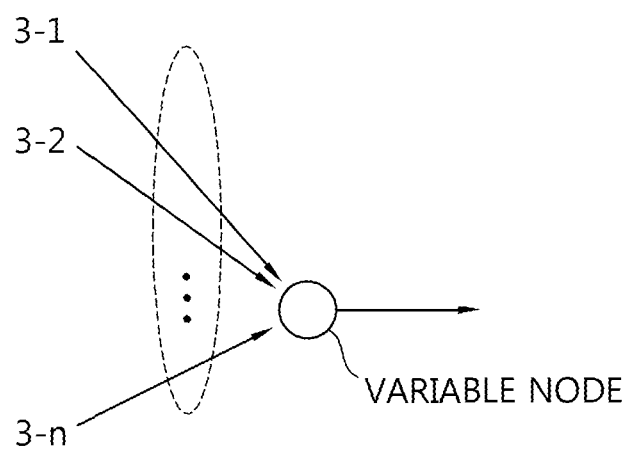
FIG. 3 shows a variable node having a plurality of inputs to which the present invention is applied.
Figure 4:
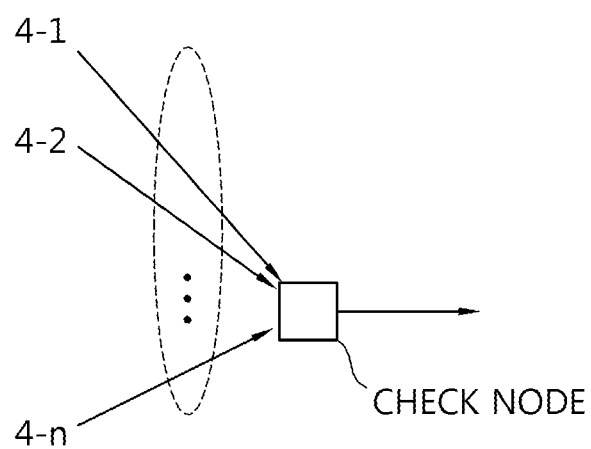
FIG. 4 shows a check node having a plurality of inputs to which the present invention is applied.

FIG. 3 shows a variable node having a plurality of inputs to which the present invention is applied, and FIG. 4 shows a check node having a plurality of inputs to which the present invention is applied. FIGS. 3 and 4 correspond to a case an algorithm (e.g., the sum-product algorithm, the minimum-sum algorithm, the normalized minimum-sum algorithm, the offset minimum-sum algorithm, or the improved minimum-sum algorithm) has been expanded to a case where the number of inputs is n. That is, the algorithm includes 'n+1' edges.

Referring to FIGS. 3 and 4, in the sum-product algorithm when the number of inputs is n, information update in the variable node is the same as Equation 13 and information update in the check node is the same as Equation 14.

$$L(r) = L(u_1) + L(u_2) + \ldots + L(u_n) \quad \text{[Equation 13]}$$

$$L(r) = 2\tanh^{-1}\left\{\tanh\left[\frac{L(u_1)}{2}\right] \cdot \tanh\left[\frac{L(u_2)}{2}\right] \ldots \tanh\left[\frac{L(u_n)}{2}\right]\right\} \quad \text{[Equation 14]}$$

Furthermore, in the minimum-sum algorithm when the number of inputs is n, information update in the variable node is the same as Equation 15, and information update in the check node is the same as Equation 16.

$$r = u_1 + u_2 + \ldots + U_n \quad \text{[Equation 15]}$$

$$r = \text{sign}(u_1)\text{sign}(u_2)\ldots\text{sign}(u_n)\min(|u_1|,|u_1|,\ldots,|u_n|) \quad \text{[Equation 16]}$$

Furthermore, in the normalized minimum-sum algorithm when the number of inputs is n, information update in the variable node is the same as Equation 17, and information update in the check node is the same as Equation 18.

$$r = u_1 + u_2 + \ldots + u_n \quad \text{[Equation 17]}$$

$$r = \alpha \cdot \text{sign}(u_1)\text{sign}(u_2)\ldots\text{sign}(u_n)\min(|u_1|,|u_1|,\ldots,|u_n|) \quad \text{[Equation 18]}$$

Furthermore, in the offset minimum-sum algorithm when the number of inputs is n, information update in the variable node is the same as Equation 19, and information update in the check node is the same as Equation 20.

$$r = u_1 + u_2 + + u_n \quad \text{[Equation 19]}$$

$$r = \text{sign}(u_1)\text{sign}(u_2)\ldots\text{sign}(u_n)\max(\min(|u_1|,|u_1|,\ldots,|u_n|)-\beta, 0) \quad \text{[Equation 20]}$$

Furthermore, in the improved minimum-sum algorithm when the number of inputs is n, in order to calculate the check node having n inputs, a case where the number of inputs is two is recursively calculated.

In the improved minimum-sum algorithm when the number of inputs is n, information update in the variable node is the same as Equation 21, and information update in the check node is the same as Equation 22.

$$r = u_1 + u_2 + \ldots + u_n \quad \text{[Equation 21]}$$

$$\begin{aligned} r &= CHK(u_1, u_2, \ldots, u_n) \\ &= CHK(u_1, CHK(u_2, \ldots, u_n)) \end{aligned} \quad \text{[Equation 22]}$$

or $$\begin{aligned} r &= CHK(u_1, u_2, \ldots, u_n) \\ &= CHK(CHK(u_1, u_2), CHK(u_3, u_4), \ldots) \end{aligned}$$

In Equations 21 and 22, a check node calculation method when the number of inputs is two is the same as Equation below.

$$CHK(u_1, u_2) = \begin{cases} a \cdot \text{sign}(u_1)\text{sign}(u_2)\min(|u_1|,|u_2|), & |u_1+u_2| \leq \sigma_{op}^2 \cdot A, \\ & |u_1-u_2| \leq \sigma_{op}^2 \cdot A \\ \text{sign}(u_1)\text{sign}(u_2)\min(|u_1|,|u_2|) - C_{offset}, & |u_1+u_2| > \sigma_{op}^2 \cdot A, \\ & |u_1-u_2| \leq \sigma_{op}^2 \cdot A \\ \text{sign}(u_1)\text{sign}(u_2)\min(|u_1|,|u_2|) + C_{offset}, & |u_1+u_2| \leq \sigma_{op}^2 \cdot A, \\ & |u_1-u_2| > \sigma_{op}^2 \cdot A \\ \text{sign}(u_1)\text{sign}(u_2)\min(|u_1|,|u_2|) & |u_1+u_2| > \sigma_{op}^2 \cdot A, \\ & |u_1-u_2| > \sigma_{op}^2 \cdot A \end{cases} \quad \text{[Equation 12]}$$

A method of calculating a check node $CHK(u_1, u_2, \ldots, u_n)$ having n inputs in accordance with the present invention is described below. The proposed method of calculating check nodes is an implementation method with low complexity.

Figure 5:
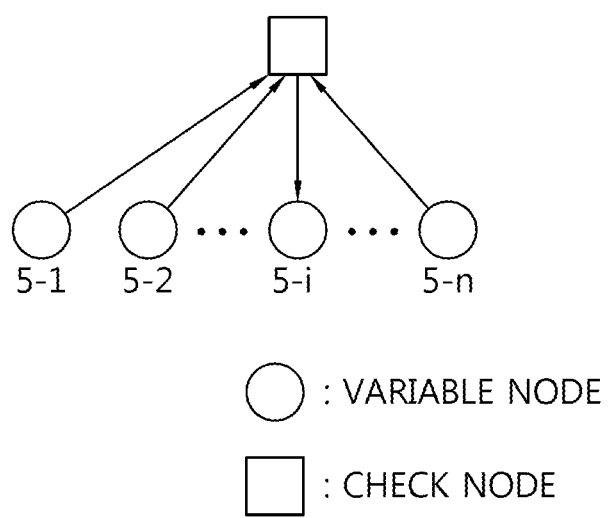
FIG. 5 shows an example in which a check node having a plurality of inputs is calculated in accordance with the present invention.

FIG. 5 shows an example in which a check node having a plurality of inputs is calculated in accordance with the present invention. FIG. 5 corresponds to a case where the number of inputs is n.

Referring to FIG. 5, the output ($5$-$i$, wherein $1 \leq i \leq n$) of an $i^{th}$ edge of a check node having n edges is calculated. The output ($5$-$i$) of the $i^{th}$ edge of the check node is calculated using $-1$ edges $5$-$1$, $5$-$2$, ..., $5$-$(i-1)$, $5$-$(i+1)$, and $5$-$n$ other than the $i^{th}$ edge of the n edges as inputs.

Meanwhile, a function '$CHK(u_1, u_2, \ldots, u_{i-1}, u_{i+1}, \ldots, u_n)$' having 'n−1' inputs can be a function for recursively calculating a function '$CHK(x,y)$' having two inputs. The complexity of the function '$CHK(u_1, u_2, \ldots, u_{i-1}, u_{i+1}, \ldots, u_n)$' can be reduced by minimizing the number of times that the function '$CHK(x,y)$' is used.

Figure 6:
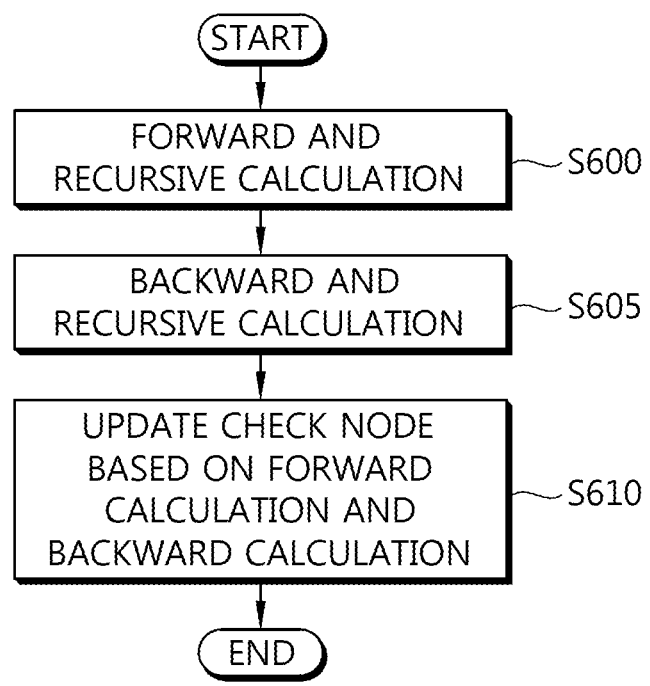
FIG. 6 is a flowchart illustrating an example of a method of calculating the output of a check node having a plurality of inputs in accordance with the present invention.

FIG. 6 is a flowchart illustrating an example of a method of calculating the output of a check node having a plurality of inputs in accordance with the present invention.

Referring to FIG. 6, the calculation of a check node using two inputs is recursively performed on a plurality of nodes forward at step S600. For example, the check node is updated in relation to a first edge and a second edge, the check node is updated in relation to a result of the update and a third edge, the check node is updated in relation to a result of the update and a fourth edge, and this process is repeated. The check node can be updated according to Equation 23.

The calculation of the check node using two inputs is recursively performed on the plurality of nodes backward at step S605. For example, the check node is updated in relation to an $n^{th}$ edge and an $(n-1)^{th}$ edge, the check node is updated in relation to a result of the update and an $(n-2)^{th}$ edge, the check node is updated in relation to a result of the update and an $(n-3)^{th}$ edge, and this process is repeated. The check node can be updated according to Equation 23.

Next, the check node is updated using the results of the forward recursive calculation and the results of the backward recursive calculation (i.e., the results of S600 and the results of S605) as inputs at step S610. The check node can be updated according to Equation 23.

Figure 7:
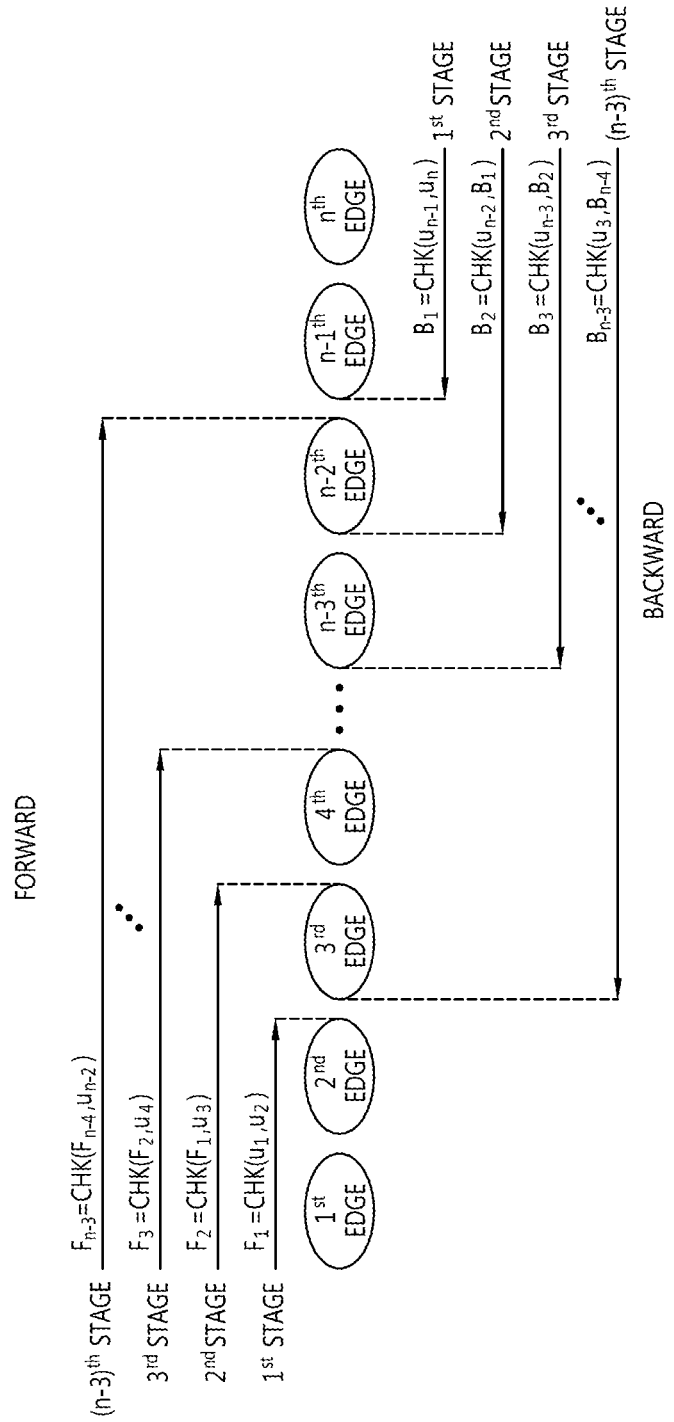
FIG. 7 shows another example in which a check node having a plurality of inputs is calculated in accordance with the present invention.

FIG. 7 shows another example in which a check node having a plurality of inputs is calculated in accordance with the present invention.

Referring to FIG. 7, it is assumed that the output of an $i^{th}$ edge of a check node having n edges is $CHK(u_1, u_2, \ldots, u_{i-1}, u_{i+1}, \ldots, u_n)$. Hereinafter, a function '$CHK(x,y)$' can be calculated according to Equation 23.

The output $CHK(u_1, u_2, \ldots, u_{i-1}, u_{i+1}, \ldots, u_n)$ is calculated by sequentially calculating the function '$CHK(x,y)$' having two inputs up to an '$(n-3)^{th}$' stage forward and backward and using a value calculated forward and a result calculated backward and the input to the function '$CHK(x,y)$'.

Particularly, forward calculation '$F_i = CHK(F_{i-1}, u_{i+1})$' and backward calculation '$B_i = CHK(U_{n-i}, B_{i-1})$' are performed up to the '$(n-3)^{th}$' stage using the function '$CHK(x,y)$' having two inputs. That is, forward '$F1, F2, \ldots, F_{n-3}$' and backward '$B_1, B_2, \ldots, B_{n-3}$' are recursively calculated.

Next, the output of the $i^{th}$ edge ($i^{th}$ edge output, wherein $1 \leq i \leq n$) of the check node is sequentially calculated using a result of the forward calculation $F_i$ and a result of the backward calculation $B_i$ as in Equation below.

$$CHK(u_1, u_2, \ldots, u_{i-1}, u_{i+1}, \ldots, u_n) = \begin{cases} CHK(u_2, B_{n-3}), & i = 1 \\ CHK(u_1, B_{n-3}), & i = 2 \\ CHK(F_{i-2}, B_{n-i-1}), & 3 \leq i \leq n-2 \\ CHK(F_{n-3}, u_n), & i = n-1 \\ CHK(F_{n-3}, u_{n-1}), & i = n \end{cases} \quad \text{[Equation 24]}$$

In accordance with the present invention, in order to calculate outputs in all the edges of the check node having n edges, a total number of the functions '$CHK(x,y)$' is '$2(n-3)+n$', that is, '$3n-6$'.

Figure 8:
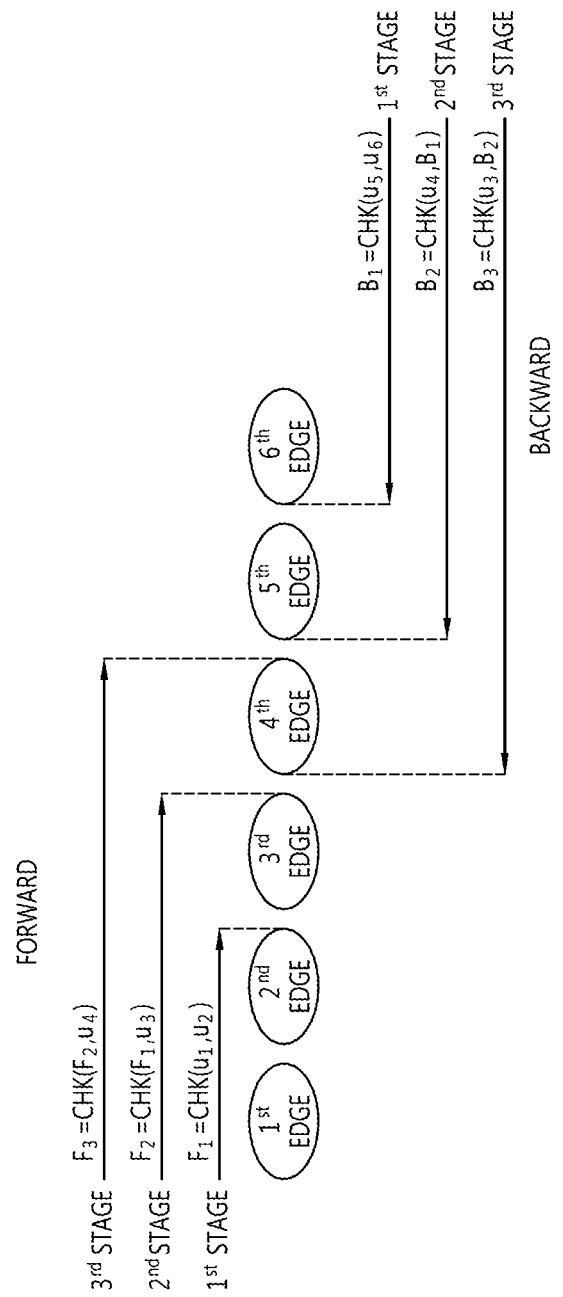
FIG. 8 shows an example of a method of calculating the outputs of edges of a check node having six inputs in accordance with the present invention.

FIG. 8 shows an example of a method of calculating the outputs of edges of a check node having six inputs in accordance with the present invention. In this method, the output of an $i^{th}$ edge of the check node having six edges is calculated with low complexity.

Referring to FIG. 8, it is assumed that the output of the $i^{th}$ edge of the check node having six edges is $CHK(u_1, u_2, \ldots, u_{i-1}, u_{i+1}, \ldots, u_n)$. Hereinafter, a function '$CHK(x,y)$' can be calculated using Equation 23.

The output '$CHK(u_1, u_2, \ldots, u_{i-1}, u_{i+1}, \ldots, u_n)$' is calculated by sequentially calculating the function '$CHK(x,y)$' having two inputs up to a '$3^{rd}$' stage forward and backward and using a value calculated forward and a value calculated backward as inputs to the function '$CHK(x,y)$'.

Particularly, forward calculation '$F_i = CHK(F_{i-1}, u_{i+1})$' and backward calculation '$B_i = CHK(U_{n-i}, B_{i-1})$' are performed up to the '$3^{rd}$' stage using the function '$CHK(x,y)$' having two inputs. That is, forward '$F1, F2, \ldots, F_3$' and backward '$B_1, B_2, \ldots, B_3$' are recursively calculated.

Next, the output of the $i^{th}$ edge ($i^{th}$ edge output, wherein $1 \leq i \leq n$) of the check node is sequentially calculated using a result of the forward calculation $F_i$, and a result of the backward calculation $B_i$ as in Equation below.

$$CHK(u_1, u_2, \ldots, u_{i-1}, u_{i+1}, \ldots, u_n) = \begin{cases} CHK(u_2, B_3), & i = 1 \\ CHK(u_1, B_3), & i = 2 \\ CHK(F_{i-2}, B_{5-i}), & 3 \leq i \leq 4 \\ CHK(F_3, u_6), & i = 5 \\ CHK(F_3, u_5), & i = 6 \end{cases} \quad \text{[Equation 25]}$$

A total number of the functions '$CHK(x,y)$' is 12.

Figure 9:
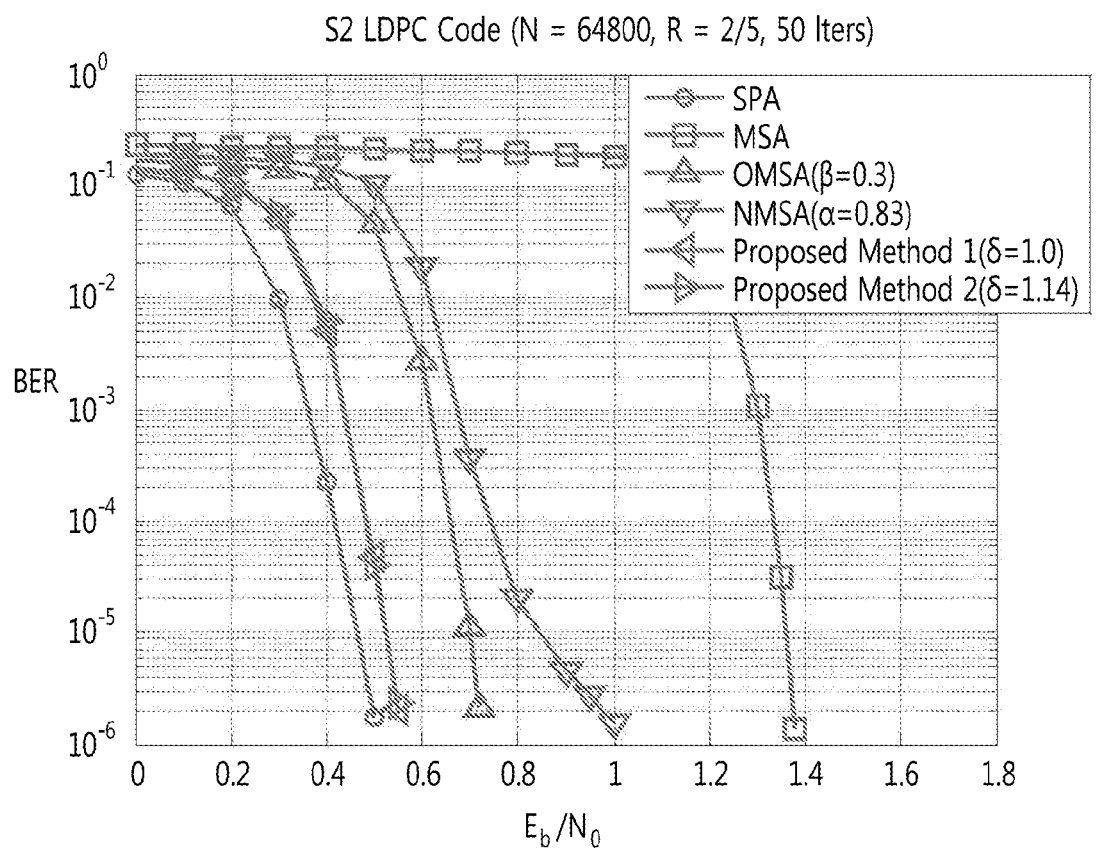
FIG. 9 is a comparison between the BER performance of a decoding algorithm and the BER performance of an improved algorithm.

FIG. 9 is a comparison between the BER performance of a decoding algorithm and the BER performance of an improved algorithm. The algorithm corresponds to a decoding algorithm of an LDPC code having a coding rate of 0.4.

Referring to FIG. 9, a 'Proposed Method 1' corresponds to the decoding of an LDPC through linear approximation (a=0.5, b=0), and a 'Proposed Method 2' corresponds to the decoding of an LDPC through step approximation (a=0, b=0).

$\sigma (=1.0)$ in an operating point for the 'Proposed Method 1' and $\sigma (=1.14)$ in an operating point for the 'Proposed Method 2' are values on which the LDPC code having a coding rate of 0.4 has the best performance.

Both the methods of decoding an LDPC through linear and step approximation are 0.05 dB poorer than the sum-product algorithm, but are 0.15 dB better than the offset minimum-sum algorithm.

Figure 10:
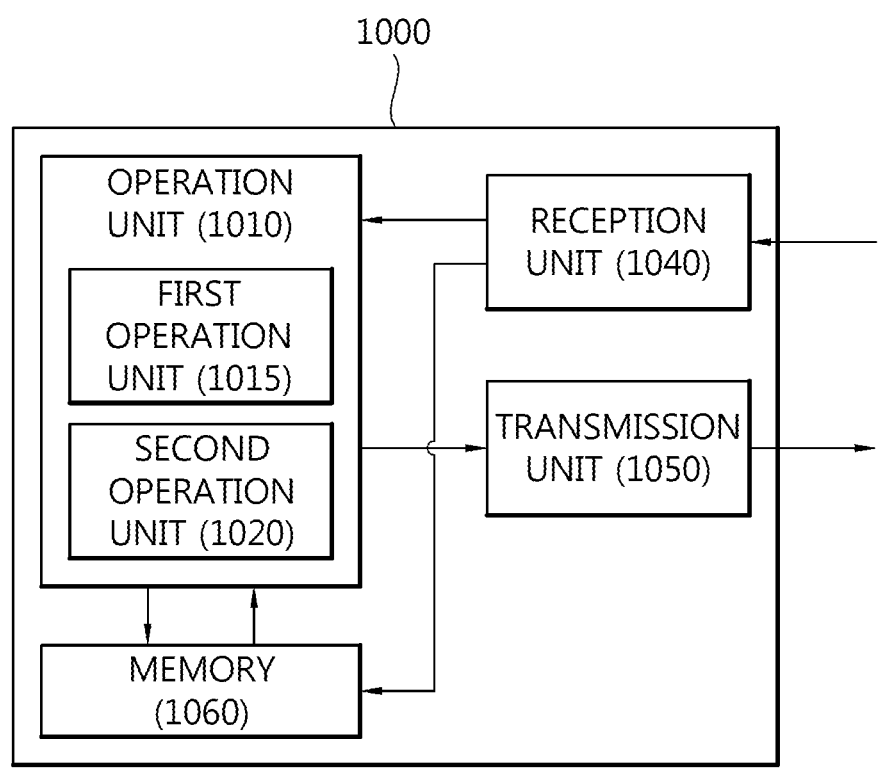
FIG. 10 is a block diagram showing an example of an apparatus for decoding an LDPC in accordance with the present invention.

FIG. 10 is a block diagram showing an example of an apparatus for decoding an LDPC in accordance with the present invention.

Referring to FIG. 10, the decoding apparatus 1000 of an LDPC code in accordance with an embodiment of the present invention includes an operation unit 1010, a reception unit 1040, a transmission unit 1050, and memory 1060.

The operation unit 1010 calculates a signal or channel information including an LDPC code, received from one or more channels, using the sum-product algorithm, the minimum-sum algorithm, the offset minimum-sum algorithm, the normalized minimum-sum, or the improved minimum-sum algorithm. The operation unit 1010 calculates the output of each edge by updating a variable node and a check node.

The operation unit 1010 can include a first operation unit 1015 for calculating a node update formula (in particular, the check node), used to decode the LDPC code, according to a predetermined operation formula. Here, the variable node or the check node can be updated according to Equations 1 to 24.

In order to apply the improved minimum-sum algorithm, the operation unit 1010 can further include a second operation unit 1020 for converting a linearization function so that it corresponds to the check node update formula of the minimum-sum algorithm by linearizing or stepwise approximating a natural log hyperbolic tangent function that is included in the check node update formula of the sum-product algorithm used to decode an LDPC code.

The reception unit 1040 can receive the signal or channel information, including the LDPC code, from the one or more channels and apply an algorithm used to decode an LDPC code through the operation unit 1010.

The transmission unit 1050 can send the results calculated by the operation unit 1010.

The memory 1060 can store data, such as the signal or channel information including the LDPC code, received through the reception unit 1040.

Furthermore, the memory 1060 can store and manage data calculated by the operation unit 1010.

The memory 1060 can be dual-port memory on which a read operation and a write operation are performed at the same time.

Meanwhile, a method of decoding an LDPC code in accordance with the present invention can include calculating a first result by calculating a check node having two inputs forward and recursively, calculating a second result by calculating the check node having two inputs backward and recursively, and calculating the check node using the first result and the second result as inputs.

Furthermore, in the decoding method, the calculation of a check node having two inputs can be performed using Equation 23.

Here, calculating the first result can include calculating Equation 1 using a first edge and a second edge as inputs and calculating Equation 1 again using a third edge and a result of the calculation as inputs.

Furthermore, calculating the second result can include calculating Equation 1 using the last edge and the second last edge as inputs and calculating Equation 1 again using the third last edge and a result of the calculation as inputs.

Furthermore, the output of a specific edge of the check node can be calculated using the remaining edges other than an edge corresponding to the output, from among all edges, as inputs.

In accordance with the present invention, the reception performance of communication and broadcasting systems can be improved, and complexity can be lowered.

The embodiments of the present invention can be implemented in the form of a program command executable by various computer means and can be recorded on a computer-readable recording medium. The computer-readable medium can include a program command, a data file, and a data structure solely or in combination. The program command recorded on the recording medium may have been specially designed and configured for the present invention or may be known to or available for a person who is skilled in the computer software. Examples of the computer-readable recording medium include hardware devices specially configured to store and execute the program command, such as magnetic media, such as a hard disk, a floppy disk, and a magnetic tape, optical media, such as CD-ROM and a DVD, magneto-optical media, such as a floptical disk, ROM, RAM, and flash memory. Examples of the program command include a machine code, such as a code written by a compiler, and a high-level language code executable by a computer using an interpreter. The hardware apparatus can be configured in the form of one or more software modules for performing the operation of the present invention, and the vice versa.

A person having ordinary skill in the art to which the present invention pertains may substitute, modify and change the present invention in various ways without departing from the technical spirit of this document. Accordingly, the present invention is not limited to the aforementioned embodiments and the accompanying drawings.

In the above exemplary system, although the methods have been described based on the flowcharts in the form of a series of steps or blocks, the present invention is not limited to the sequence of the steps, and some of the steps may be performed in a different order from that of other steps or may be performed simultaneous to other steps. Furthermore, those skilled in the art will understand that the steps shown in the flowchart are not exclusive and the steps may include additional steps or that one or more steps in the flowchart may be deleted without affecting the scope of the present invention.

What is claimed is:
1. A computer-implemented method of decoding a Low Density Parity Check (LDPC) code, the method comprising:
receiving the LDPC code through a channel; and
decoding the LDPC code using check nodes and variable nodes,
wherein decoding the LDPC code includes:
calculating, using a computer, first results by performing a calculation having first and second inputs forward and recursively using a plurality of edges of a check node;
calculating, using the computer, second results by performing the calculation backward and recursively using the plurality of edges; and
calculating, using the computer, a value of the check node by performing the calculation using at least one of the first results and the second results as the first and second inputs, respectively,
wherein N is a count of the edges of the plurality of edges,
wherein performing the calculation forward and recursively includes:
calculating the first result for a first stage by performing the calculation using values of first and second edges as the first and second inputs, respectively, and
calculating the first result for an $n^{th}$ stage by performing the calculation using values of the first result for an $(n-1)^{th}$ stage and an $(n+1)^{th}$ edge as the first and second inputs, respectively, wherein n is greater than or equal to 2 and less than or equal to N−3, and
wherein performing the calculation backward and recursively includes:

calculating the second result for the first stage by performing the calculation using values of the $N^{th}$ and an $(N-1)^{th}$ edge as the first and second inputs, respectively, and calculating the second result for the $n^{th}$ stage by performing the calculation using values of the second result for an $(n-1)^{th}$ stage and an $(N-n)^{th}$ edge as the first and second inputs, respectively, wherein n is greater than or equal to 2 and less than or equal to N−3.

2. The method of claim 1, wherein the calculation having the first and second inputs is calculated according to Equation below:

$$CHK(u, v) = \begin{cases} a \cdot \text{sign}(u)\text{sign}(v)\min(|u|, |v|), & |u+v| \leq \sigma_{op}^2 \cdot A, \\ & |u-v| \leq \sigma_{op}^2 \cdot A \\ \text{sign}(u)\text{sign}(v)\min(|u|, |v|) - C_{offset}, & |u+v| > \sigma_{op}^2 \cdot A, \\ & |u-v| \leq \sigma_{op}^2 \cdot A \\ \text{sign}(u)\text{sign}(v)\min(|u|, |v|) + C_{offset}, & |u+v| \leq \sigma_{op}^2 \cdot A, \\ & |u-v| > \sigma_{op}^2 \cdot A \\ \text{sign}(u)\text{sign}(v)\min(|u|, |v|) & |u+v| > \sigma_{op}^2 \cdot A, \\ & |u-v| > \sigma_{op}^2 \cdot A \end{cases}$$ [Equation]

wherein 'u' and 'v' indicate information about respective inputs of each node, 'sign( )' indicates a code of an input value, 'min( )' indicates a minimum value of the input values, a value '$C_{offset}$' is '$(\sigma_{op}^2)(b+\ln 2)/4$', '$\sigma_{op}^2$' is a distribution of channel noise of the channel in an operating point, 'a' is a slope of an equation obtained by approximating a function 'ln cos h( )' into a linear function, and 'b' is an intercept in a vertical axis that is obtained by approximating the function 'ln cos h( )' into a linear function.

3. The method of claim 1, wherein the value of the check node corresponding to the first edge is calculated by using the second result which is the same as the second result for calculating the value of the check node corresponding to the second edge.

4. The method of claim 1, wherein the value of the check node corresponding to the $N^{th}$ node is calculated by using the first result which is the same as the first result for calculating the value of the check node corresponding to the $(N-1)^{th}$ edge.

5. The method of claim 1, wherein an output of a specific edge of the check node is calculated using remaining edges other than the edge corresponding to the output, from among all edges, as the inputs.

6. An apparatus for decoding a Low Density Parity Check (LDPC) code, comprising:
a reception unit for receiving an LDPC code through a channel;
a memory for storing or updating a value of a check node;
an operation unit for performing a decoding operation on the LDPC code using the value of the check node,
wherein the operation unit calculates first results by performing a calculation having first and second inputs forward and recursively using a plurality of edges of the check node, calculates second results by performing the calculation backward and recursively using the plurality of edges, and calculates the value of the check node by performing the calculation using the first result and the second result as the first and second inputs, respectively,
wherein N is a count of the edges of the plurality of edges,
wherein performing the calculation forward and recursively includes:
calculating the first result for a first stage by performing the calculation using values of first and second edges as the first and second inputs, respectively, and
calculating the first result for an $n^{th}$ stage by performing the calculation using values of the first result for an $(n-1)^{th}$ stage and an $(n+1)^{th}$ edge as the first and second inputs, respectively, wherein n is greater than or equal to 2 and less than or equal to N−3, and
wherein performing the calculation backward and recursively includes:
calculating a first backward update by performing the calculation using values of the $N^{th}$ and an $(N-1)^{th}$ edge as the first and second inputs, respectively,
calculating the second result for the $n^{th}$ stage by performing the calculation using values of the second result for an $(n-1)^{th}$ stage and an $(N-n)^{th}$ edge as the first and second inputs, respectively, wherein n is greater than or equal to 2 and less than or equal to N−3.

7. The apparatus of claim 6, wherein the operation unit calculates the check node having the first and second inputs according to Equation below:

$$CHK(u, v) = \begin{cases} a \cdot \text{sign}(u)\text{sign}(v)\min(|u|, |v|), & |u+v| \leq \sigma_{op}^2 \cdot A, \\ & |u-v| \leq \sigma_{op}^2 \cdot A \\ \text{sign}(u)\text{sign}(v)\min(|u|, |v|) - C_{offset}, & |u+v| > \sigma_{op}^2 \cdot A, \\ & |u-v| \leq \sigma_{op}^2 \cdot A \\ \text{sign}(u)\text{sign}(v)\min(|u|, |v|) + C_{offset}, & |u+v| \leq \sigma_{op}^2 \cdot A, \\ & |u-v| > \sigma_{op}^2 \cdot A \\ \text{sign}(u)\text{sign}(v)\min(|u|, |v|) & |u+v| > \sigma_{op}^2 \cdot A, \\ & |u-v| > \sigma_{op}^2 \cdot A \end{cases}$$ [Equation]

wherein 'u' and 'v' indicate information about respective inputs of each node, 'sign( )' indicates a code of an input value, 'min( )' indicates a minimum value of the input values, a value '$C_{offset}$' is '$(\sigma_{op}^2)(b+\ln 2)/4$', '$\sigma_{op}^2$' is a distribution of channel noise of the channel in an operating point, 'a' is a slope of an equation obtained by approximating a function 'ln cos h( )' into a linear function, and 'b' is an intercept in a vertical axis that is obtained by approximating the function 'ln cos h( )' into a linear function.

8. The apparatus of claim 6, wherein the operation unit calculates the value of the check node corresponding to the first edge by using the second result which is the same as the second result for calculating the value of the check node corresponding to the second edge.

9. The apparatus of claim 6, wherein the operation unit calculates the value of the check node corresponding to the $N^{th}$ node by using the first result which is the same as the first result for calculating the value of the check node corresponding to the $(N-1)^{th}$ edge.

10. The apparatus of claim 6, wherein the operation unit calculates an output of a specific edge of the check node using remaining edges other than the edge corresponding to the output, from among all edges, as the inputs.

11. The apparatus of claim 6, wherein the memory is a dual-port memory on which a read operation and a write operation are simultaneously performed.

* * * * *